United States Patent
Fazelpour et al.

(10) Patent No.: US 6,762,494 B1
(45) Date of Patent: Jul. 13, 2004

(54) ELECTRONIC PACKAGE SUBSTRATE WITH AN UPPER DIELECTRIC LAYER COVERING HIGH SPEED SIGNAL TRACES

(75) Inventors: Siamak Fazelpour, San Diego, CA (US); Jean-Marc Papillon, San Diego, CA (US); Steven J. Martin, La Mesa, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/254,120

(22) Filed: Sep. 24, 2002

(51) Int. Cl.$^7$ ................................................. H01L 23/34
(52) U.S. Cl. ...................... 257/728; 257/259; 257/275; 257/604; 257/662; 257/664; 257/778
(58) Field of Search ................................ 257/199, 259, 257/275–277, 482, 523, 604, 624–625, 659, 662, 664, 728, 778

(56) References Cited

U.S. PATENT DOCUMENTS

| | | | | |
|---|---|---|---|---|
| 4,184,133 A | * | 1/1980 | Gehle | 333/238 |
| 4,242,157 A | * | 12/1980 | Gehle | 157/64 |
| 4,659,872 A | * | 4/1987 | Dery et al. | 174/117 |
| 4,997,698 A | * | 3/1991 | Oboodi et al. | 428/209 |
| 5,149,590 A | * | 9/1992 | Arthur et al. | 428/421 |
| 5,149,615 A | * | 9/1992 | Chakravorty et al. | 430/313 |
| 5,646,440 A | * | 7/1997 | Hasegawa | 257/635 |
| 6,225,238 B1 | * | 5/2001 | Wu | 438/778 |

* cited by examiner

Primary Examiner—David Nelms
Assistant Examiner—Andy Huynh
(74) Attorney, Agent, or Firm—Incaplaw; Terrance A. Meador

(57) ABSTRACT

An electronic package component includes a flip-chip device mounted to a BGA substrate. The BGA substrate includes conductive traces formed on its upper surface and configured in a coplanar waveguide structure. The package includes a dielectric coating applied over the conductive traces and over the upper surface of the substrate. The coating is formed from a material having a dielectric constant that is equal to or approximately equal to the dielectric constant of the BGA substrate material. The dielectric coating reduces the adverse effects caused by phase velocity dispersion of the signal propagated by the coplanar waveguide.

24 Claims, 4 Drawing Sheets

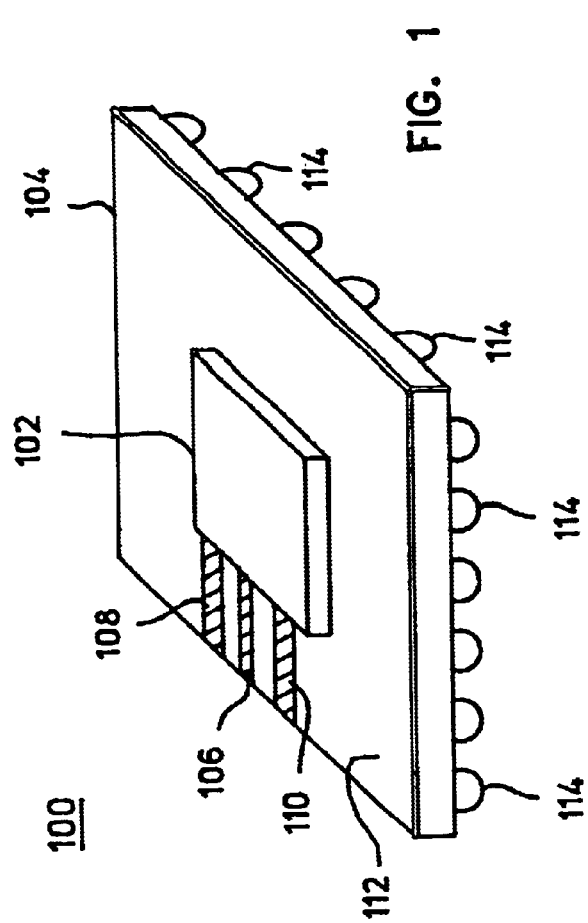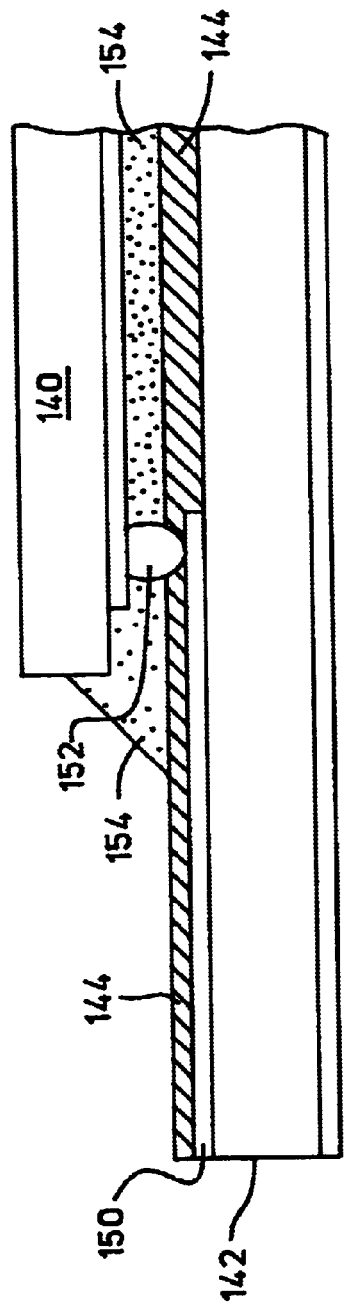

ELECTRONIC PACKAGE SUBSTRATE WITH AN UPPER DIELECTRIC LAYER COVERING HIGH SPEED SIGNAL TRACES

FIELD OF THE INVENTION

The present invention relates generally to electronic packages. More particularly, the present invention relates to an electronic package having an upper dielectric layer that dampens dispersion effects corresponding to the transmission of high speed signals.

BACKGROUND OF THE INVENTION

An electronic package often includes a substrate having high speed signal traces formed on its upper surface. For example, a high speed transmission line can be realized as a coplanar waveguide ("CPW") having signal and reference traces on the upper surface, a microstrip line having the signal trace on the upper surface and a reference plane below the upper surface, or a mixed mode structure that utilizes a CPW with an underlying reference plane. Routing high speed signals on the top layer of the package substrate is desirable because the signal need not experience a trace-to-via transition, which introduces a discontinuity and causes impedance mismatches. As a result of such signal routing, the dielectric constant of the material above the signal trace (i.e., air) may differ from the dielectric constant of the material below the signal trace (i.e., the package substrate material). Different dielectric constants lead to different phase velocities of electromagnetic wave propagation through the respective materials. This effect is known as dispersion, which adversely impacts the electrical performance of the high speed signal line. Dispersion increases as the difference between the dielectric constants increases. In practical applications, dispersion results in lost signal power, particularly at high frequencies. Consequently, dispersion can be problematic in some very high speed applications (e.g., OC-768 system and subsystem components) that require very low losses at frequencies up to 100 GHz.

BRIEF SUMMARY OF THE INVENTION

An electronic package substrate configured in accordance with the techniques described herein includes an upper metal layer that defines a number of conductive traces. In one embodiment, the conductive traces form a CPW structure. These conductive traces are covered with material having a dielectric constant that is approximately equal to the dielectric constant of the underlying substrate material. The dielectric coating reduces the negative effects associated with dispersion.

The above and other aspects of the present invention may be carried out in one form by an electronic package component comprising a substrate formed from a material having a first dielectric constant, at least one conductive signal trace formed above the upper surface of the substrate, and a coating formed over the conductive signal trace, where the coating is formed from a material having a second dielectric constant that is approximately equal to the first dielectric constant.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 1 is a schematic perspective view of an electronic package;

FIG. 5 is a schematic cross sectional view of a portion of the electronic package component of FIG. 4, as viewed from line B—B.

DETAILED DESCRIPTION OF A PREFERRED EMBODIMENT

Figure 2:
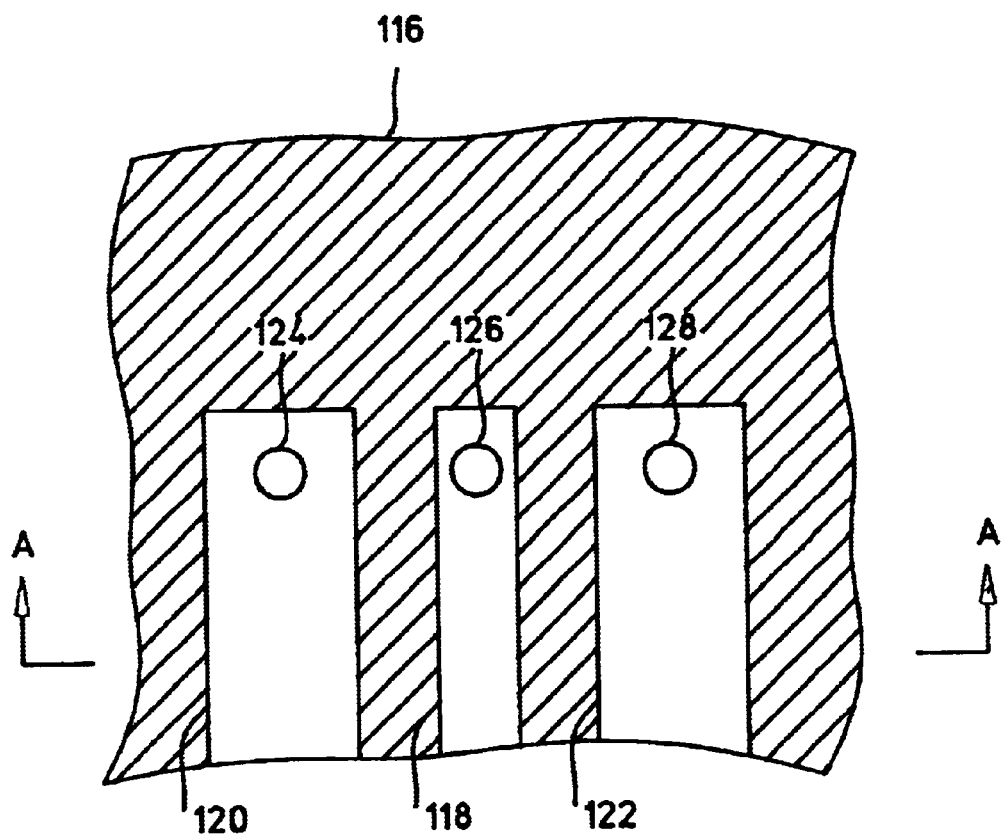
FIG. 2 is a schematic top view of a portion of an electronic package substrate with a dielectric coating applied thereto.

The particular implementations shown and described herein are illustrative of the invention and its best mode and are not intended to otherwise limit the scope of the invention in any way. Indeed, for the sake of brevity, conventional techniques related to electronic package manufacturing, high speed signal transmission (such as coplanar waveguide and microstrip design), and other aspects of the example embodiments may not be described in detail herein.

High speed data communication systems and subsystems typically employ electronic packages that contain one or more electronic devices (e.g., semiconductor chips) mounted to an interconnect structure that facilitates connection of the electronic devices to another component such as a printed circuit board or the like. Optical data communication applications, for example, often utilize flip-chip devices mounted to ball grid array ("BGA") interconnect substrates to form an electronic device package that accommodates data rates of up to 40 Gbps. In this regard, FIG. 1 is a schematic perspective view of a simplified electronic package 100 configured in accordance with an example embodiment. Electronic package 100 generally includes an electronic device 102 connected (electrically and physically) to an interconnect element 104. In this example, electronic device 102 is a flip-chip device and interconnect element 104 is a BGA substrate.

Electronic device 102 includes a number of solder bump terminals that establish contact with conductive traces formed on the upper surface of BGA substrate 104. The solder bump terminals, which are hidden from view in FIG. 1, are located on the lower surface of electronic device 102. For simplicity, electronic package 100 is depicted with only three exposed conductive traces: a high speed conductive signal trace 106 and two conductive reference traces 108/110 forming a coplanar waveguide ("CPW") transmission line. In practice, electronic package 100 may include any number of conductive signal and reference traces arranged in accordance with known RF/microwave transmission line techniques. Electronic device 102 may be configured to suit the needs of the particular application, and the specific functionality of electronic device 102 is unimportant for purposes of this description. For example, electronic device 102 may provide any number of input/output terminals for low speed signals, high speed signals, control signals, operating voltages, and the like. Accordingly, the specific design and manufacture of electronic device 102 is beyond the scope of this description.

In many practical applications, the interconnect element is realized as a BGA substrate 104. BGA substrate 104 can be fabricated using conventional techniques and known materials. For example, BGA substrate 104 may be based upon an organic material, a ceramic material (e.g., LTCC or HTCC material), or any appropriate material. The specific electrical and physical characteristics of the substrate material may vary from application to application. BGA substrate 104 may include one or more conductive layers sandwiched between one or more dielectric layers. BGA substrate 104 may include a conductive interconnect arrangement of vias and internal traces that serves to route signals from the upper surface 112 of BGA substrate 104 to the lower surface of BGA substrate 104. In accordance with the illustrated embodiment, the conductive traces 106/108/110 are located on upper surface 112. In a practical embodiment, the number of conductive traces, the arrangement of conductive traces on upper surface 112, and the design of the internal interconnect structure will vary to suit the needs of the particular application. Although not depicted in FIG. 1, electronic package 100 preferably includes a dielectric coating or final layer formed over the conductive traces 106/108/110 and those portions of upper surface 112 that would otherwise be exposed. The dielectric coating is described in more detail below.

Electronic package 100 also includes a number of conductive terminals 114, which can be realized as solder balls in a practical embodiment. Solder balls 114 are connected to corresponding capture pads located on the lower surface of BGA substrate 104. The capture pads correspond to end points of the internal interconnect structure of BGA substrate 104. In turn, solder balls 114 provide electrical and physical connection points for electronic package 100 to facilitate mounting of electronic package 100 to another component, e.g., a circuit board or a motherboard.

FIG. 2 is a schematic top view of a portion of an electronic package substrate 116 with a dielectric coating applied thereto. The dielectric coating is represented by the cross hatching in FIG. 2. In other words, the dielectric coating covers substantially all of the surface shown in FIG. 2. In this example, substrate 116 includes a CPW structure having a high speed conductive signal trace 118 and two conductive reference traces 120/122. Alternatively, substrate 116 may include a conductive signal trace (without corresponding conductive reference traces) that cooperates with an underlying reference plane to form a microstrip transmission line. The dielectric coating can be formed on conductive signal trace 118, on conductive reference traces 120/122, and on portions of the upper surface of substrate 116 that are not covered by the conductive traces. In a practical embodiment, the coating includes one or more openings (e.g., holes 124/126/128) that provide access to the conductive traces for mounting of an electronic device. Holes 124/126/128 are configured to accommodate the flip-chip solder bumps such that a suitable connection can be established between the solder bumps and the conductive traces (see FIG. 5). Thus, a signal solder bump from the flip-chip is connected through hole 126 to conductive signal trace 118, a reference solder bump from the flip-chip is connected through hole 124 to conductive reference trace 120, and a reference solder bump from the flip-chip is connected through hole 128 to conductive reference trace 122. As an alternative to using separate holes or openings, the coating may include a single opening (or any number of openings) formed therein that spans across all three of the conductive traces.

Figure 3:
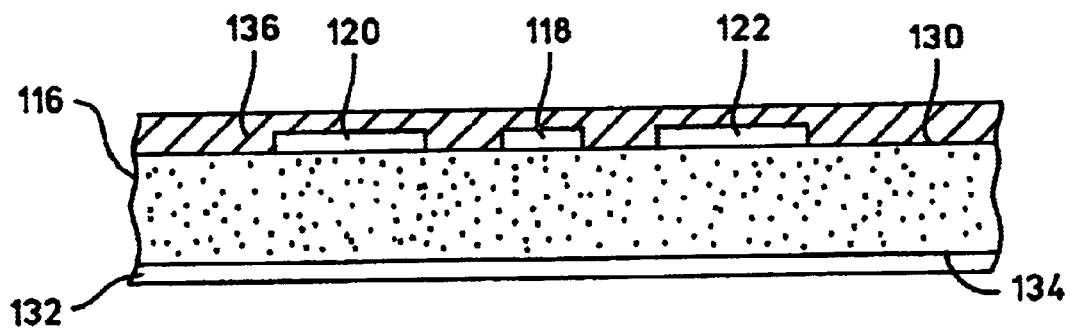
FIG. 3 is a schematic cross sectional view of the electronic package substrate of FIG. 2, as viewed from line A—A.

FIG. 3 is a schematic cross sectional view of electronic package substrate 116, as viewed from line A—A in FIG. 2. FIG. 3 depicts conductive signal trace 118 and conductive reference traces 120/122 as being formed on the upper surface 130 of substrate 116. The electronic package also includes a conductive reference plane 132 formed on the lower surface 134 of substrate 116 (opposite upper surface 130). Conductive reference plane 132 cooperates with the conductive traces to form a reference-backed CPW structure (also known as a mixed-mode transmission line structure). FIG. 3 schematically illustrates the dielectric coating 136 as a thin layer formed above upper surface 130, conductive signal trace 118, and conductive reference traces 120, 122. In practice, coating 136 is deposited and formed on upper surface 130 and the conductive traces without any intervening layers.

Substrate 116 is formed from a dielectric material having a certain dielectric constant, while coating 136 is formed from a dielectric material having a dielectric constant that is equal to, or approximately equal to, the dielectric constant of substrate 116. In theory, substrate 116 and coating 136 can be formed from the same dielectric material (thus resulting in the same dielectric constant). Practical manufacturing, and cost considerations, however, make the use of different materials desirable in many applications. Although different materials may be used, substrate 116 and coating 136 are preferably formed from the same type of material, e.g., both are ceramic-based materials or both are organic-based materials. This ensures that the coefficient of thermal expansion and other physical characteristics of the materials remain similar. In accordance with one example embodiment, substrate 116 is formed from an HTCC alumina material having a dielectric constant of approximately 9.0, while coating 136 is formed from a fired ceramic paste material having a dielectric constant of approximately 8.5. In contrast, the dielectric constant of air (corresponding to the uncoated case) is 1.0, which is considerably less than the dielectric constant of alumina. In accordance with another example embodiment, substrate 116 is formed from an organic BT based material having a dielectric constant of approximately 4.0, while coating 136 is formed from a soldermask material having a dielectric constant of approximately 4.2.

Application of the dielectric coating 136 reduces the undesirable dispersion effect by increasing the dielectric constant in the space surrounding the conductive traces to a value that exceeds the dielectric constant of air. The dielectric constant of the coating material need not be equal to the dielectric constant of the substrate material. Indeed, in most practical applications, the dielectric constants will be unequal. In this regard, the beneficial effects of the dielectric coating 136 increase as the dielectric constant of the coating material increases, and optimized performance is obtained as the dielectric constant of the coating material approaches the dielectric constant of substrate 116.

Figure 4:
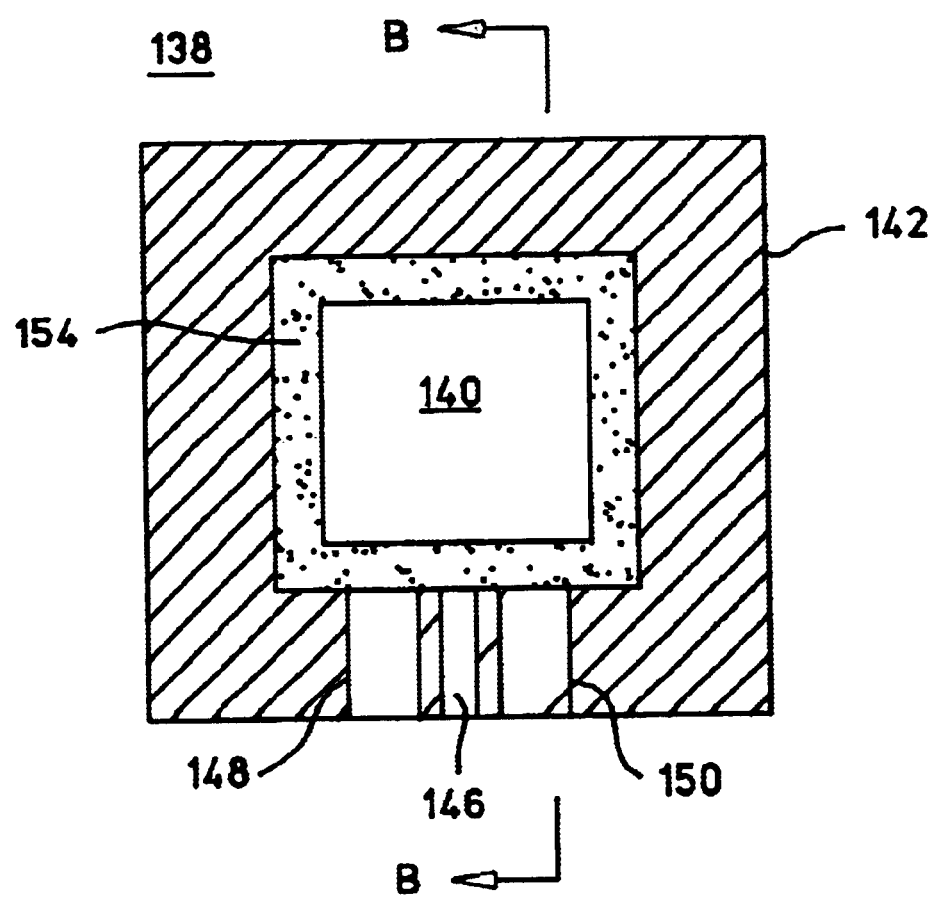
FIG. 4 is a schematic top view of an electronic package component.

FIG. 4 is a schematic top view of an electronic package component 138 having a flip-chip device 140 connected to a substrate 142. FIG. 5 is a schematic cross sectional view of a portion of electronic package component 138, as viewed from line B—B in FIG. 4. The cross hatching of substrate 142 in FIG. 4 represents a dielectric coating 144 formed over the upper surface of substrate 142. Flip-chip 140 is connected to a conductive signal trace 146 and to two conductive reference traces 148/150 in the manner described above.

FIG. 5 depicts the manner in which a flip-chip solder bump 152 extends through an opening in coating 144 to establish physical and electrical contact with conductive reference trace 150. Solder bump 152, along with one or more additional solder bumps (not shown) keeps the flip-chip die above the upper surface of substrate 142. In accordance with conventional packaging techniques, a suitable underfill material 154 may be deposited between flip-chip 140 and coating 144. Underfill material 154 functions as a protectant for the flip-chip solder bumps, strengthens the bond between flip-chip 140 and substrate 142, and functions as stress relief for the solder bumps. Under normal manufacturing conditions, underfill material 154 may extend slightly beyond the outer perimeter of flip-chip 140, as shown in FIG. 4 and FIG. 5. Notably, underfill material 154 does not protrude a significant distance away from flip-chip 140. Due to coating 144, underfill material 154 does not contact any of the conductive traces located on the upper surface of substrate 142. Nor does underfill material 154 contact the substrate material. Rather, underfill material 154 merely contacts coating 144 and the lower portions of flip-chip 140.

In accordance with a simulated example embodiment, the electronic package component utilizes an HTCC (alumina) substrate having a dielectric constant of 9.0 and a thickness of 10 mils. The thickness of each conductive metal trace and the bottom reference plane is 0.3 mils. The width of the signal trace is 5.5 mils, and the gap spacing between the signal trace and each of the reference traces is 6 mils, thus establishing a 50 Ohm transmission impedance at 20 GHz. For this example, the material for the dielectric coating is selected to be a ceramic soldermask paste. The thickness of the dielectric coating is approximately 1.1 mils (measured from the upper surface of the substrate), and the dielectric constant of the coating is 9.0.

In contrast to an uncoated version of the same package, the coated version exhibits a substantially uniform 10–15 dB lower return loss across the measured frequency range (up to 100 GHz), according to simulated test results. At frequencies higher than 60 GHz, the coated version exhibits measurably less insertion loss than the uncoated version. This improved performance can be attributed to the reduction in dispersion caused by the dielectric coating.

Figure 6:
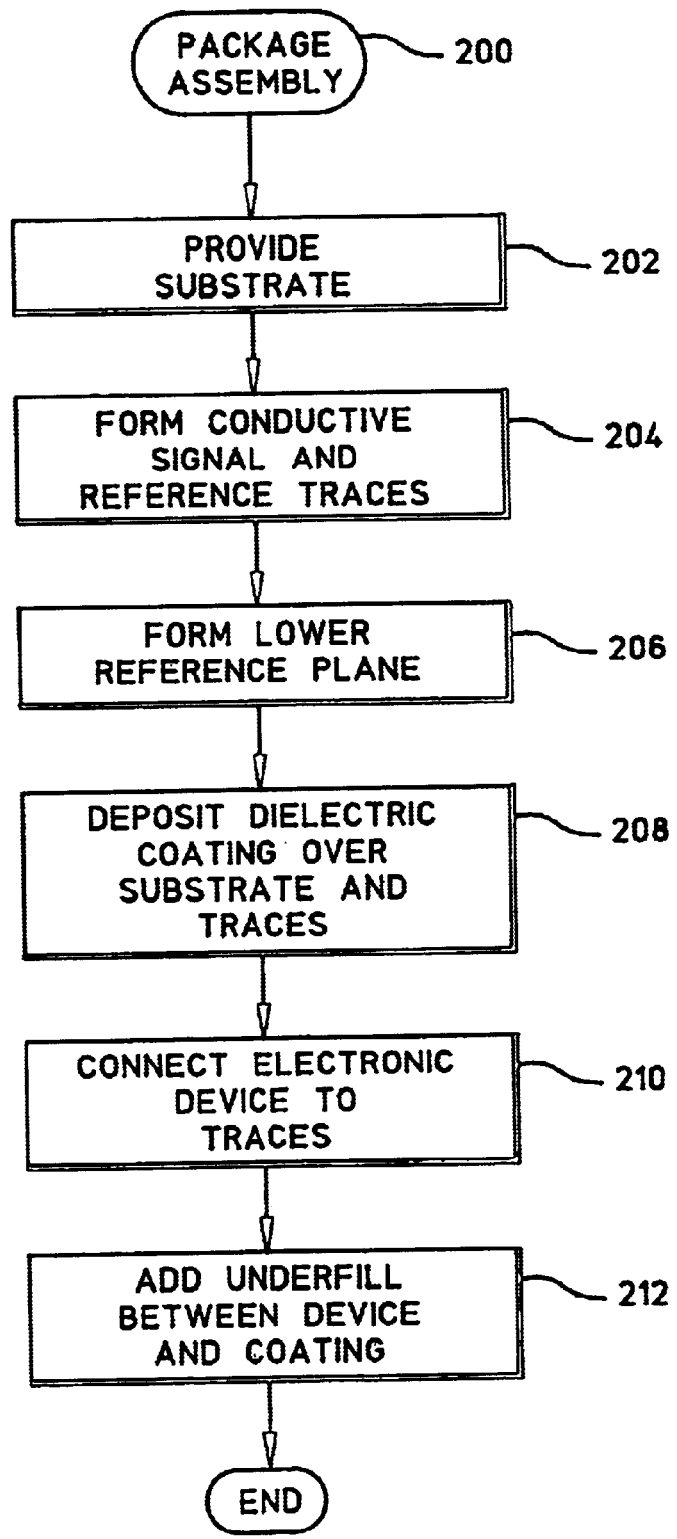
FIG. 6 is a flow diagram of an electronic package assembly process.

FIG. 6 is a flow diagram of an electronic package assembly process 200 that may be performed to fabricate an electronic package as described herein. Process 200 begins with a task 202, which provides a suitable substrate for use as the foundation for the electronic package. The substrate is configured to accommodate the needs of the particular application, and it may be formed from any suitable ceramic, organic, or other material having a first dielectric constant. One or more conductive signal traces are formed on the upper surface of the substrate (task 204) to facilitate high speed RF/microwave signal propagation. If the electronic package supports a CPW transmission mode, then conductive reference traces are also formed on the upper surface of the substrate during task 204. If the electronic package supports a microstrip mode or a ground-backed CPW mode, then a conductive reference plane is formed on the lower surface of the substrate (task 206).

After the conductive traces have been formed on the upper surface of the substrate, the dielectric coating can be deposited over the exposed portions of the upper surface of the substrate and over the conductive traces located on the upper surface (task 208). As described above, task 208 may employ known soldermasking techniques and materials to form a layer having an appropriate thickness (typically 1–3 mils). The coating material has a second dielectric constant that is equal to or approximately equal to the first dielectric constant. In practical embodiments, task 208 initially deposits the coating material over the entire surface of the substrate. Thereafter, portions of the coating layer are removed to form openings or holes for the electronic device terminals or solder bumps. Once the openings are formed, the coating layer can be fired or otherwise processed into its final form.

Once the dielectric coating has been applied, the electronic device can be connected to the conductive traces on the upper surface of the substrate using any number of known techniques (task 210). In accordance with the example described herein, task 210 represents a flip-chip mounting procedure. Alternatively, task 210 may be associated with a wire or ribbon bonding procedure for attaching a surface mounted die to the substrate. If desired, an underfill material is added between the electronic device and the coating layer (task 212). The underfill material can be injected under the device and cured into its final form; as mentioned above, the underfill material is only applied around the footprint of the device and not over the entire surface of the substrate.

Process 200 may include any number of additional and/or alternative tasks related to other aspects of the manufacture and configuration of the electronic package. In addition, the tasks described in connection with process 200 need not be performed in the order depicted in FIG. 6, and any number of equivalent fabrication procedures may fall within the intended scope of this description and the appended claims.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An electronic package component comprising:
   a substrate formed from a material having a first dielectric constant, said substrate having an upper surface;
   a conductive signal trace on said upper surface;
   a plurality of conductive reference traces on said upper surface, said conductive signal trace and said plurality of conductive reference traces forming a coplanar waveguide transmission line; and
   a coating formed on said conductive signal trace, said plurality of conductive reference traces, and portions of said upper surface not covered by said conductive signal trace or said plurality of conductive reference traces, said coating formed from a material having a second dielectric constant; wherein
   said substrate has a lower surface opposite said upper surface;
   said electronic package component further comprises a conductive reference plane on said lower surface; and
   said conductive signal trace, said plurality of conductive reference traces, and said conductive reference plane form a reference-backed coplanar waveguide transmission line.

2. The electronic package component according to claim 1, wherein:
   said material for said substrate is ceramic-based; and
   said material for said coating is ceramic-based.

3. The electronic package component according to claim 2, wherein said material for said substrate and said material for said coating are different.

4. The electronic package component according to claim 1, wherein:
   said material for said substrate is organic-based; and
   said material for said coating is organic-based.

5. An The electronic package component according to claim 4, wherein said material for said substrate and said material for said coating are different.

6. The electronic package component according to claim 1, further comprising an electronic device connected to said conductive signal trace and to each of said plurality of conductive reference traces.

7. The electronic package component according to claim 6, further comprising an underfill material between said electronic device and said coating.

8. The electronic package component according to claim 6, wherein:
said electronic device is a flip-chip device having a signal solder bump and a plurality of reference solder bumps;
said signal solder bump is connected to said conductive signal trace;
each of said plurality of reference solder bumps is connected to one of said plurality of conductive reference traces; and
said coating includes one or more openings configured to accommodate a connection between said signal solder bump and said conductive signal trace, and connections between said plurality of reference solder bumps and said plurality of conductive reference traces.

9. The electronic package component according to claim 1, wherein said second dielectric constant is approximately equal to said first dielectric constant.

10. An electronic package component comprising:
a substrate formed from a material having a first dielectric constant, said substrate having an upper surface;
a conductive signal trace on said upper surface;
a plurality of conductive reference traces on said upper surface, said conductive signal trace and said plurality of conductive reference traces forming a coplanar waveguide transmission line;
a coating formed on said conductive signal trace, said plurality of conductive reference traces, and portions of said upper surface not covered by said conductive signal trace or said plurality of conductive reference traces, said coating formed from a material having a second dielectric constant; and
an electronic device connected to said conductive signal trace and to each of said plurality of conductive reference traces; wherein,
said electronic device is a flip-chip device having a signal solder bump and a plurality of reference solder bumps;
said signal solder bump is connected to said conductive signal trace;
each of said plurality of reference solder bumps is connected to one of said plurality of conductive reference traces; and
said coating includes one or more openings configured to accommodate a connection between said signal solder bump and said conductive signal trace, and connections between said plurality of reference solder bumps and said plurality of conductive reference traces.

11. The electronic package component according to claim 10, wherein said second dielectric constant is approximately equal to said first dielectric constant.

12. The electronic package component of claim 10, wherein:
said substrate has a lower surface opposite said upper surface;
said electronic package component further comprises a conductive reference plane on said lower surface; and
said conductive signal trace, said plurality of conductive reference traces, and said conductive reference plane form a reference-backed coplanar waveguide transmission line.

13. The electronic package component according to claim 10, wherein:
said material for said substrate is ceramic-based; and
said material for said coating is ceramic-based.

14. The electronic package component according to claim 13, wherein said material for said substrate and said material for said coating are different.

15. The electronic package component according to claim 10, wherein:
said material for said substrate is organic-based; and
said material for said coating is organic-based.

16. The electronic package component according to claim 15, wherein said material for said substrate and said material for said coating are different.

17. The electronic package component according to claim 10, further comprising an underfill material between said electronic device and said coating.

18. An electronic package component comprising:
a substrate formed from a material having a first dielectric constant, said substrate having an upper surface;
a conductive signal trace on said upper surface;
a plurality of conductive reference traces on said upper surface, said conductive signal trace and said plurality of conductive reference traces forming a coplanar waveguide transmission line;
a coating formed on said conductive signal trace, said plurality of conductive reference traces, and portions of said upper surface not covered by said conductive signal trace or said plurality of conductive reference traces, said coating formed from a material having a second dielectric constant; and
an electronic device connected to said conductive signal trace and to each of said plurality of conductive reference traces; wherein
said first dielectric constant is approximately equal to said second dielectric constant;
said substrate has a lower surface opposite said upper surface;
said electronic package component further comprises a conductive reference plane on said lower surface; and
said conductive signal trace, said plurality of conductive reference traces, and said conductive reference plane form a reference-backed coplanar waveguide transmission line.

19. The electronic package component according to claim 18, wherein:
said electronic device is a flip-chip device having a signal solder bump and a plurality of reference solder bumps;
said signal solder bump is connected to said conductive signal trace;
each of said plurality of reference solder bumps is connected to one of said plurality of conductive reference traces; and
said coating includes one or more openings configured to accommodate a connection between said signal solder bump and said conductive signal trace, and connections between said plurality of reference solder bumps and said plurality of conductive reference traces.

20. The electronic package component according to claim 19, wherein:
said material for said substrate is ceramic-based; and
said material for said coating is ceramic-based.

21. The electronic package component according to claim 20, wherein said material for said substrate and said material for said coating are different.

22. The electronic package component according to claim 19, wherein:

said material for said substrate is organic-based; and said material for said coating is organic-based.

23. The electronic package component according to claim 22, wherein said substrate and said material for said coating are different.

24. The electronic package component according to claim 19, further comprising an underfill material between said electronic device and said coating.

* * * * *